United States Patent [19]
Fujioka et al.

[11] Patent Number: 5,768,765
[45] Date of Patent: Jun. 23, 1998

[54] COMPONENT MOUNTING APPARATUS

[75] Inventors: Teruhiko Fujioka; Tomosuke Okawa, both of Hamamatsu, Japan

[73] Assignee: Samsung Aerospace Industries, Ltd., Kyongsangnam-do, Rep. of Korea

[21] Appl. No.: 602,086

[22] Filed: Feb. 15, 1996

[30] Foreign Application Priority Data

Feb. 21, 1995 [JP] Japan ................................. 7-032741
Feb. 22, 1995 [JP] Japan ................................. 7-033396

[51] Int. Cl.$^6$ ........................... H05K 3/30; H05K 13/04
[52] U.S. Cl. ..................... 29/740; 29/743; 29/DIG. 44; 294/2; 294/64.1; 414/752
[58] Field of Search ............................ 29/740, 741, 743, 29/DIG. 44; 294/2, 64.1; 414/737, 752

[56] References Cited

U.S. PATENT DOCUMENTS

| 4,624,050 | 11/1986 | Hawkswell ........................ 29/743 X |
| 4,951,383 | 8/1990 | Amao et al. ....................... 29/740 X |
| 5,018,936 | 5/1991 | Izumi et al. ........................... 414/752 |
| 5,172,468 | 12/1992 | Tanaka et al. ..................... 29/740 X |
| 5,397,423 | 3/1995 | Bantz et al. ....................... 29/743 X |
| 5,410,801 | 5/1995 | Shiloh et al. .......................... 29/740 |

FOREIGN PATENT DOCUMENTS

| 110898 | 5/1991 | Japan ...................................... 29/743 |
| 354197 | 12/1992 | Japan ...................................... 29/743 |

*Primary Examiner*—Peter Vo
*Attorney, Agent, or Firm*—Finnegan, Henderson, Farabow, Garrett & Dunner, L.L.P.

[57] ABSTRACT

A component mounting apparatus includes a first pair of clamping members installed to face each other and to move toward and away from a hollow rod, and a second pair of clamping members installed to face each other at a predetermined angle with respect to the first clamping members and to move toward and away from the hollow rod. The first clamping members are driven by a first actuator and the second clamping members are driven by a second actuator. Thus, components of various configurations including any rectangle can be easily clamped. Another component mounting apparatus includes a lightweight component positioning unit. A component is picked up by a component pick-up unit protruding from the component positioning unit whose width becomes larger, positioned, and held by the component positioning unit. Thus, damage of the component can be prevented and component pick-up and mounting operations can be rapidly performed.

4 Claims, 15 Drawing Sheets

COMPONENT MOUNTING APPARATUS

BACKGROUND OF THE INVENTION

The present invention relates to a component mounting apparatus for automatically mounting electronic components on a board such as a printed circuit board.

An electronic component mounting apparatus is used to automatically mount various electronic components on a printed circuit board. The electronic component mounting apparatus is comprised of guide rails, used as a board supporting stage, for guiding the board to a predetermined position, and a component stage for supporting the various components to be mounted. It is further provided with a mounting head which moves in a plane according to X-Y coordinates to transfer an electronic component to the desired location on the board for mounting. The mounting head has a suctorial bit or in other words a suction nozzle for picking up an electronic component by vacuum pressure. The suctorial bit or suction nozzle can move up and down with respect to both the board supporting stage and the component stage.

The versatility of an electronic component mounting apparatus, and in turn, its ultimate use, can be measured in terms of its ability to handle a variety of electronic components of different shapes and varying dimensions. A conventional component mounting apparatus, however, has limitations in this regard. Another problem with the conventional apparatus is the difficulty in accurately positioning such variously sized electronic components once they are picked up.

SUMMARY OF THE INVENTION

To overcome the above problems, the present invention provides a component mounting apparatus for clamping and positioning multi-sized components held onto suction bits or in other words, suction nozzles.

To achieve the above object, there is provided a component mounting apparatus for automatically mounting a component onto a board, comprising: a mounting head movably installed between the board and a component stage for supporting the component; a pressing member driving housing installed at an end portion of the mounting head; a hollow rod installed so as to axially slide through the pressing member driving housing, having provided on an end portion of a suctorial bit for picking up and holding the component; and a first pair of pressing members or in other words clamping members installed in the pressing member driving housing facing each other to move toward and away from the hollow rod; a second pair of pressing members or in other words clamping members disposed at a predetermined angle with respect to the first pressing members to move toward and away from the hollow rod; a first actuator for driving the first pair of pressing members; and a second actuator for driving the second pair of pressing members, so that the component held by the suctorial bit is clamped and released.

Preferably, each of the first and second pair of pressing members has an inner pressing portion and an outer pressing portion, each pair of pressing portion capable of clamping a component; the first and second pair of pressing members are detachably installed in the pressing member driving housing; and a spring member is further provided to elastically bias each pressing member toward the hollow rod, so that components are elastically supported by the pressing members.

According to the component mounting apparatus as constituted above, a component held by the suctorial bit is accurately clamped and positioned by the pressing members installed in the pressing member driving housing. Any rectangular component can be clamped since the first pressing members are driven by the first actuator and the second pressing members are driven by the second actuator. Further, components of various sizes can be clamped with reduced movement stroke since each pressing member has an inner pressing portion and an outer pressing portion.

The detachably installed pressing members can be easily replaced when worn. Also, a component can be clamped without collision between the pressing members and the component since the pressing members are elastically biased toward the hollow rod by the spring member.

In another aspect, there is also provided a component mounting apparatus comprising: a mounting head movably installed between a board and a component stage for supporting a component; a bit main body combined with the mounting head; a hollow pipe member combined with the bit main body to move along the axis thereof; component positioning means combined with the hollow pipe member to be biased inwardly and protruding from the end of the hollow pipe, the width of the component positioning means becoming larger when the bit main body descends, and smaller when the bit main body ascends; and component pick-up means installed to move along the axis of the bit main body within the component positioning means, for moving away from the component positioning means to pick up and hold the component when the width of the component positioning means gets larger, wherein the component picked up by the component pick-up means is accurately positioned with respect to the component pick-up means and held when the width of the component positioning means gets smaller.

A plate spring may be used as the component positioning means to hold and laterally position the held component. The use of the lightweight plate spring as the component positioning means prevents component damage, and thus the component can be smoothly positioned without receiving any great impact during rapid positioning.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 1:
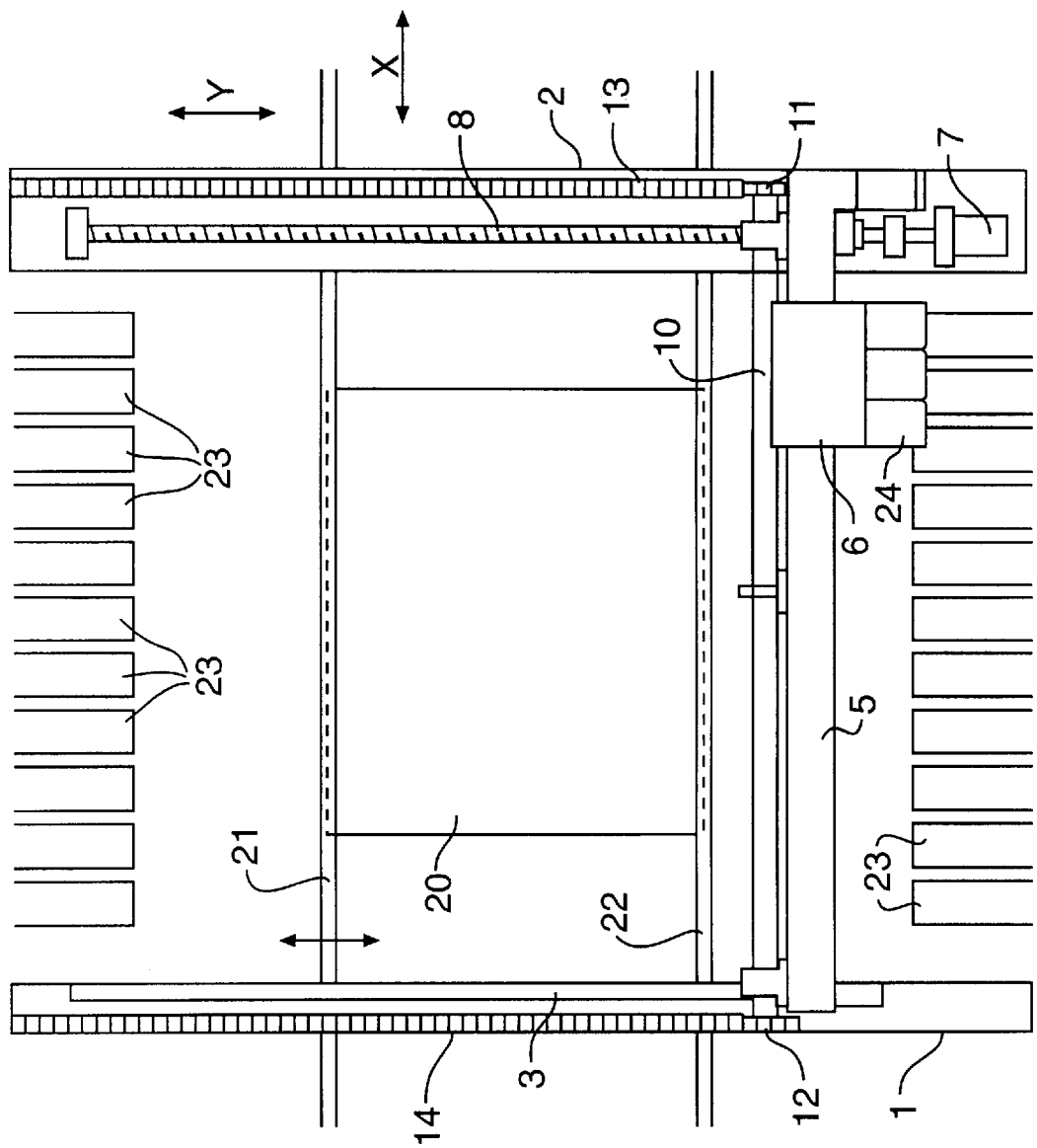
FIG. 1 is a schematic plan view of an electronic component mounting apparatus according to an embodiment of the present invention.
Figure 2:
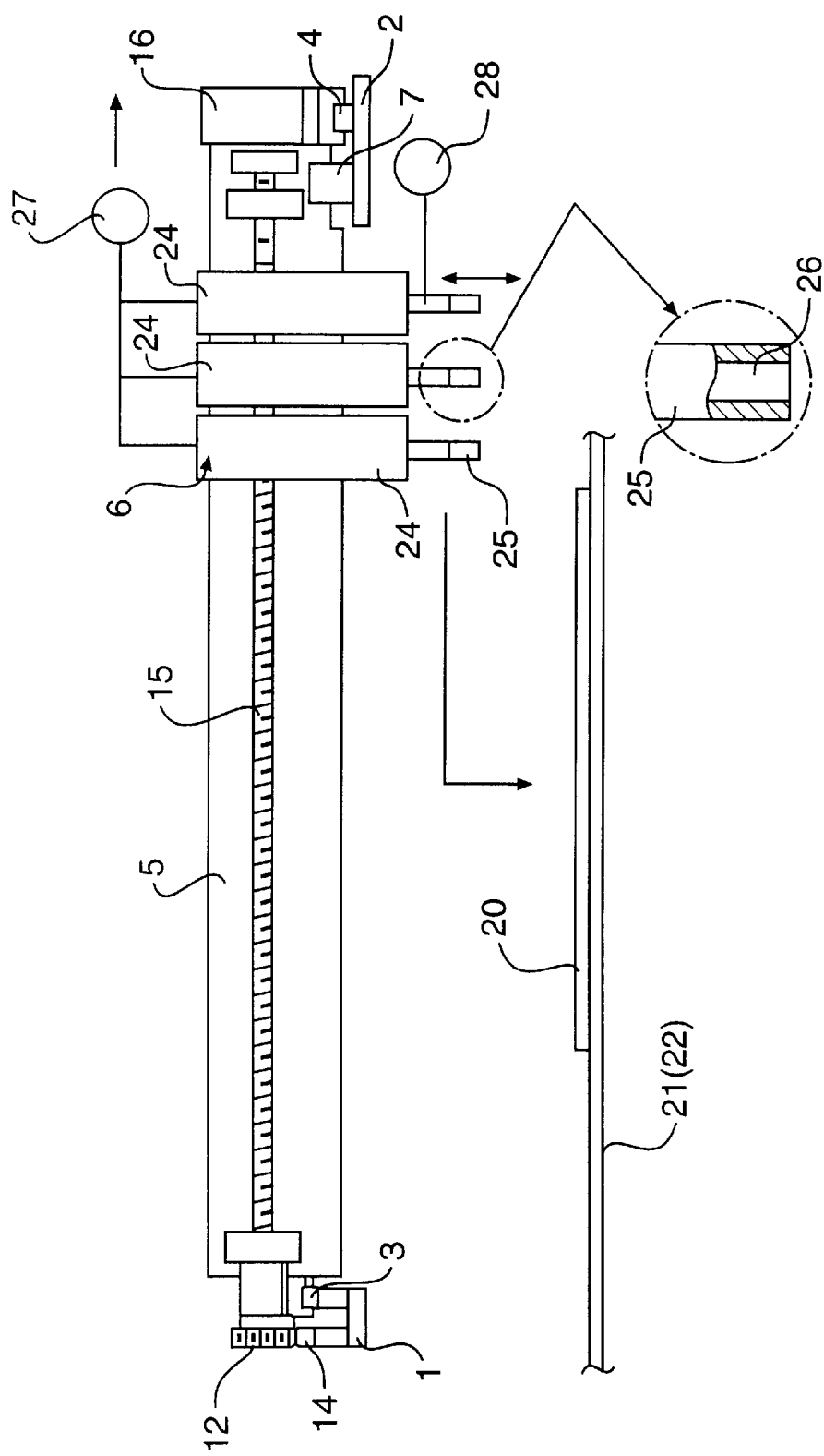
FIG. 2 is a front view of the apparatus shown in FIG. 1.

FIG. 1 is a plan view of an electronic component mounting apparatus according to the first embodiment of the present invention and FIG. 2 is a front view of the apparatus shown in FIG. 1.

Referring to FIGS. 1 and 2, the electronic component mounting apparatus has a pair of main supports 1 and 2 disposed in parallel and guide rails 3 and 4 combined with the main supports 1 and 2, respectively. Orthogonal to the main supports 1 and 2, a cross-bar 5 whose end portions are respectively coupled to the guide rails 3 and 4 is guided in the Y-axis direction along the main supports 1 and 2. A head unit 6 is slidably coupled on a cross-bar 5 to move in the X-axis direction.

To move the cross-bar 5 in the Y-axis direction, a ball screw 8 driven by a motor 7 is rotatably combined with the main support 2. The ball screw 8 is threaded with an end portion of the cross-bar 5. An interlocking shaft 10 is installed to the cross-bar 5 in parallel with the cross-bar 5. Pinion gears 11 and 12, being fixed to either end of the interlocking shaft 10, engage rack gears 13 and 14 fixed to the main supports 2 and 1, respectively. Therefore, when the ball screw 8 is driven by the motor 7, the cross-bar 5 moves in the Y-axis direction. Then, the pinion gears 11 and 12 engaged with the rack gears 13 and 14 rotate, thus moving the cross-bar 5 in the Y-axis direction at right angles with respect to the main supports 1 and 2.

A ball screw 15 is rotatably installed to the cross-bar 5 to move a head unit 6 in the X-axis direction. The ball screw 15 is threaded with the head unit 6 and may be driven by a timing belt (not shown) travelling over a pulley (not shown) installed on the shaft of a motor 16 and a pulley (not shown) installed at the ball screw 15.

A pair of guide members 21 and 22 are installed in parallel under the main supports 1 and 2 extending orthogonally with respect to the guide members. The guide members 21 and 22 form a conveyer for transferring a board 20, e.g., a printed circuit board. The board 20 is guided to a predetermined position on a board supporting stage (not shown) by the guide members 21 and 22. The guide member 21 can move toward and away from the guide member 22, according to the size of the board 20.

A plurality of component stages 23 for supporting various electronic components are provided on both sides of the conveyer formed by the guide members 21 and 22. A plurality of mounting heads 24 are installed on the head unit 6 to mount the component of each component stage 23 on the board 20.

As shown in FIG. 2, a mounting head 24 has a suctorial bit 25 (nozzle) which can move up and down. The suctorial bit 25 picks up a component from the component stage 23 and mounts the component at a predetermined position on the board 20 by moving the cross-bar 5 along the main supports 1 and 2 in the Y-axis direction and by simultaneously moving the mounting head 24 along the cross-bar 5 in the X-axis direction. To pick up the component, the suctorial bit 25 first moves downward towards the component stage 23, and then upward and to the predetermined position of the board 20. Thereafter, by lowering the suctorial bit 25, the component is mounted at the predetermined position on the board 20.

The suctorial bit 25 has a nozzle hole 26 communicating with a vacuum pump 27. The component is picked up and held against the end of the suctorial bit 25 by vacuum pressure provided by the vacuum pump 27 through the nozzle hole 26. A pressure sensor 28 is provided to detect the pressure at the nozzle hole 26, which approximates atmospheric pressure when the suctorial bit 25 is free of the component and, using the vacuum pump 27, is set at a predetermined level below atmospheric pressure whenever the suctorial bit 25 holds a component. Although FIG. 2 shows one pressure sensor 28 installed only in a single mounting head 24, same pressure sensors are in fact provided for each mounting head 24.

Figure 3:
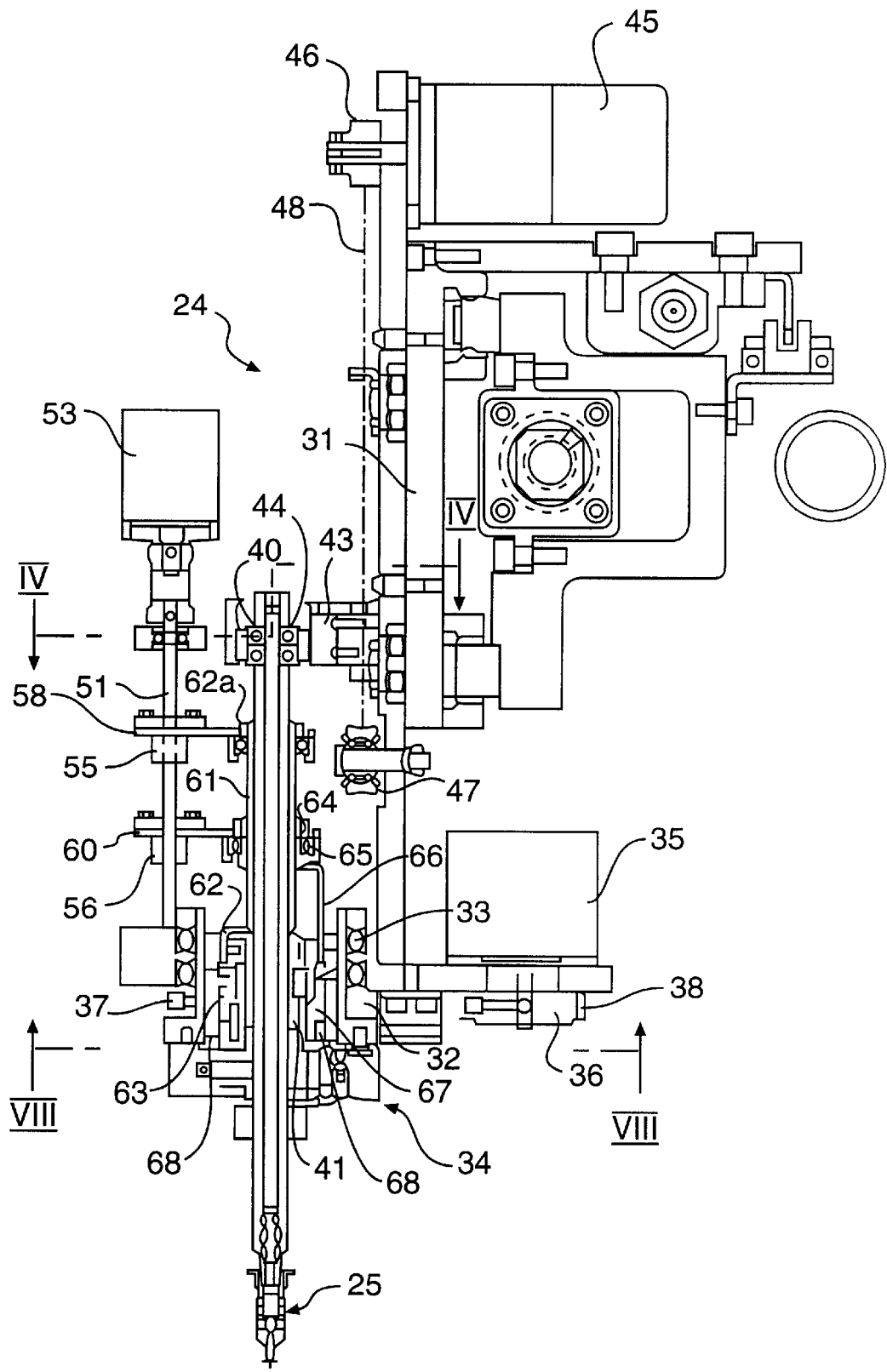
FIG. 3 is an end view of a mounting head shown in FIGS. 1 and 2.

FIG. 3 is a sectional view of one of the three mounting heads 24 shown in FIGS. 1 and 2. A cylindrical member 32 is rotatably installed by a bearing 33 at a supporting plate 31 vertically fixed to the frontal surface of the cross-bar 5. A pressing member driving housing 34 is fixed to an end of the cylindrical member 32. To rotate the cylindrical member 32, a pulley 36 fixed to the shaft or a motor 35, a pulley 37 fixed to the cylindrical member 32, and a timing belt 38 for connecting the pulleys 36 and 37, are used.

Figure 4:
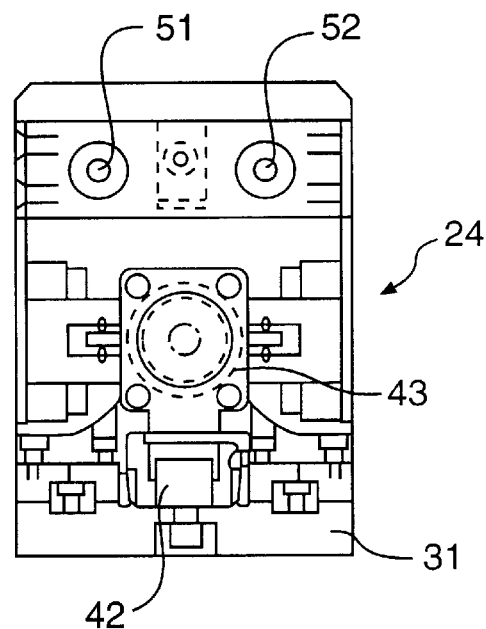
FIG. 4 is a view taken along line IV—IV of FIG. 3.
Figure 5:
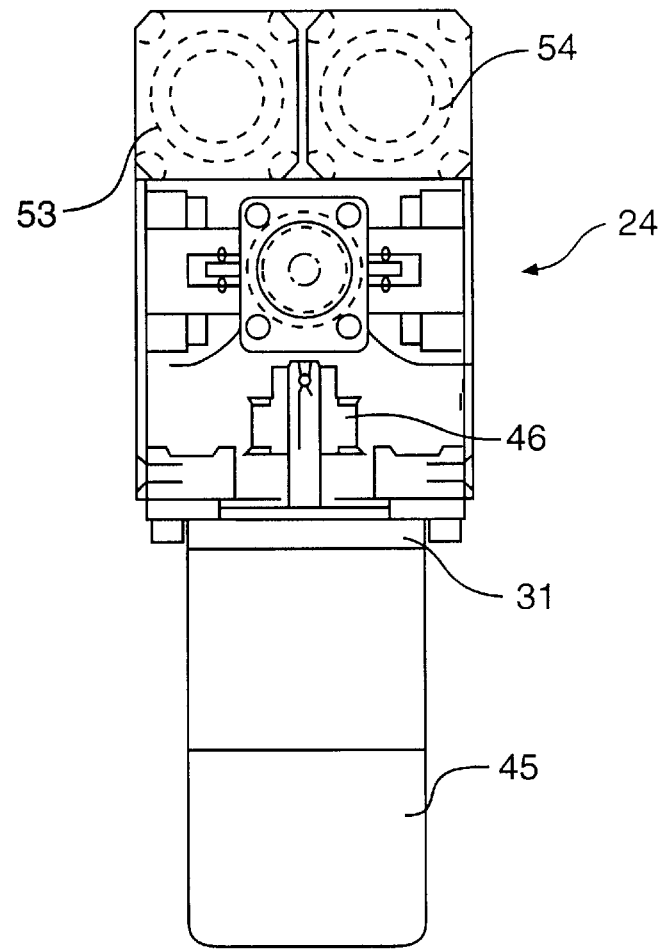
FIG. 5 is a plan view of the mounting head shown in FIG. 3.

A hollow rod 40 is installed in the middle portion of the cylinder member 32 by a thrust bearing 41 so that the hollow rod 40 can axially slide. As shown in FIG. 4, to axially descend and ascend the hollow rod 40, a guide rail 42 extending in parallel with the hollow rod 40 is combined with the supporting plate 31. A slider 43 installed to slide along the guide rail 42 is combined with a rear end of the hollow rod 40 by a bearing 44. A pulley 46 is fixed to the shaft of a motor 45 fixed to the upper end of the supporting plate 31. A timing belt 48 is installed between the pulley 46 and a pulley 47 rotatably combined with the lower end of the supporting plate 31. The slider 43 is fixed to the timing belt 48. Thus, when the motor 45 operates, the slider 43 slides along the guide rail 42, thus moving the hollow rod 40 up and down.

Figure 6:
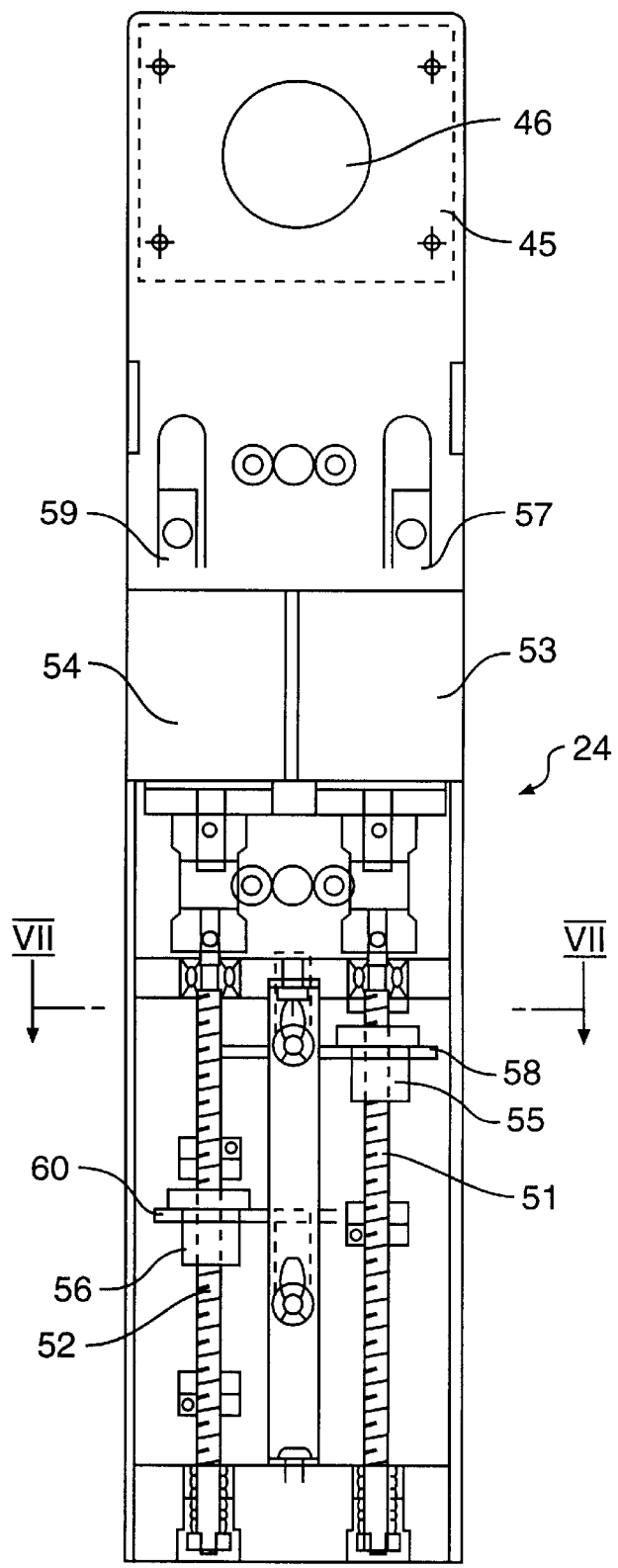
FIG. 6 is a front view of the mounting head shown in FIG. 3.

FIG. 6 is a front view of the mounting head 24 shown in FIG. 3. Two ball screws 51 and 52 are rotatably installed in the mounting head 24. The ball screws 51 and 52 are rotated by a motor 53 as a first actuator for driving later-described first pair of pressing, or in other words clamping, members and a motor 54 as a second actuator for driving later-described second pair of pressing, or in other words clamping members and threaded with nuts 55 and 56, respectively.

Figure 7:
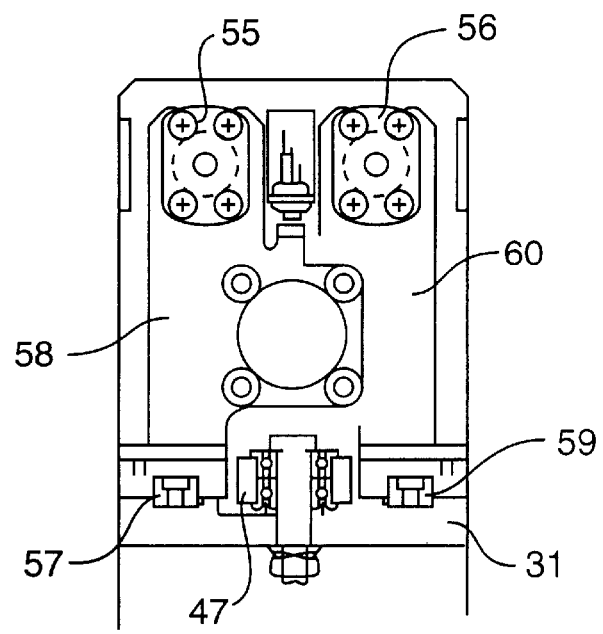
FIG. 7 is a view taken along line VII—VII of FIG. 6.

As shown in FIG. 7, the nut 55 is fixed to a sliding plate 58 which is installed to slide along a guide rail 57. The guide rail 57 is fixed to the supporting plate 31 in parallel with the guide rail 42. Similarly, the nut 56 is fixed to a sliding plate 60 which is installed to slide along a guide rail 59. The guide rail 59 is fixed to the supporting plate 31 in parallel with the guide rail 42.

As shown in FIG. 3, the sliding plate 58 is combined with a sleeve 61 installed to axially slide in the outside of the hollow rod 40 by a bearing 62a. The sleeve 61 is connected to a cam member 63 by the connection member 62. Similarly, the sliding plate 60 is connected to a ring retainer 64 installed to axially slide in the outside of the sleeve 61 by a bearing 65. The ring retainer 64 is connected to a cam member 67 by a connection member 66.

Figure 8:
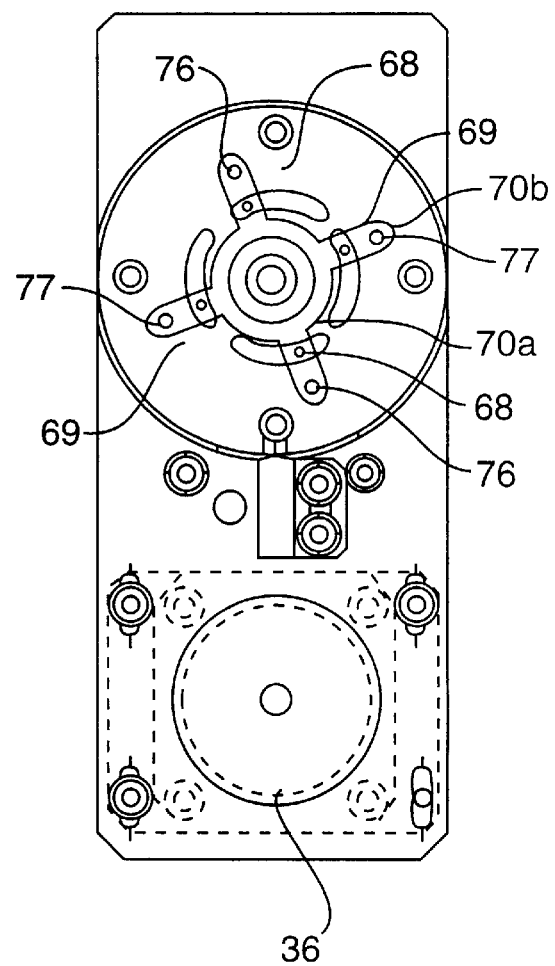
FIG. 8 is a view taken along line VIII—VIII of FIG. 3.

Therefore, when the motors 53 and 54 are driven, the cam members 63 and 67 move by means of the ball screws 51 and 52 in the same direction as the sliding of the hollow rod 40. Pins 68 and 69 are rotated by the axial movement of the cam members 63 and 67. As shown in FIG. 8, the two pins 68 rotated by the cam member 63 are installed to face or in other words diametrically opposite each other at a rotation member 70a. The two pins 69 rotated by the cam member 67 are installed to face or in other words diametrically opposite each other at a rotation member 70b.

Figure 9:
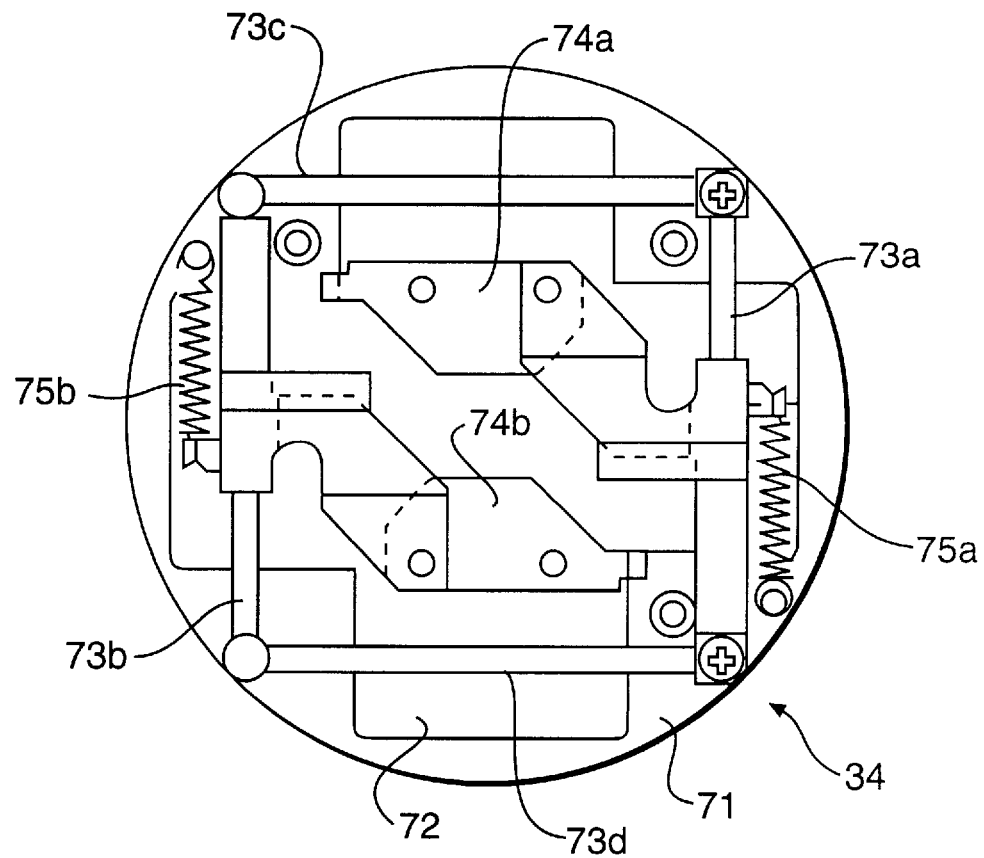
FIG. 9 is a bottom view of the bottom plate of a pressing member driving housing.

FIG. 9 shows a bottom plate 71 of the pressing member driving housing 34. The bottom plate 71 has a hollow portion 72 having the general shape of a plus sign. Four guide rods 73a–73d are fixed on the bottom plate 71 into a rectangular pattern. Each of the guide rods 73a–73d is combined with a pressing member driving plate so that the pressing member driving plate can axially slide along its respective guide rod. FIG. 9, for convenience of illustration shows only two pressing member driving plates 74a and 74b combined with the two parallel guide rods 73a and 73b so that the pressing member driving plates 74a and 74b can slide. The other guide rods 73c and 73d are combined with pressing member driving plates (not shown) so that the pressing member driving plates can slide.

The pressing member driving plates 74a and 74b are elastically biased in their mutual advancing direction by tension coil springs 75a and 75b. Two pins 76 fixed to the rotation member 70a having the pins 68 are combined with the rotation member 70a having the pins 68 are combined with the pressing member driving plates 74a and 74b shown in FIG. 9. Therefore, when the rotation member 70a is rotated, the pressing member driving plates 74a and 74b move away from each other by resisting the elasticity of the tension coil springs 75a and 75b, respectively. Similarly, two pins 77 fixed to the rotation member 70b having the pins 69 are combined with pressing member driving plates (not shown) which are combined with the guide rods 73c and 73d to slide along the guide rods 73c and 73d. Thus, when the rotation member 70b is rotated, the pressing member driving plates move away from each other.

Figure 10:
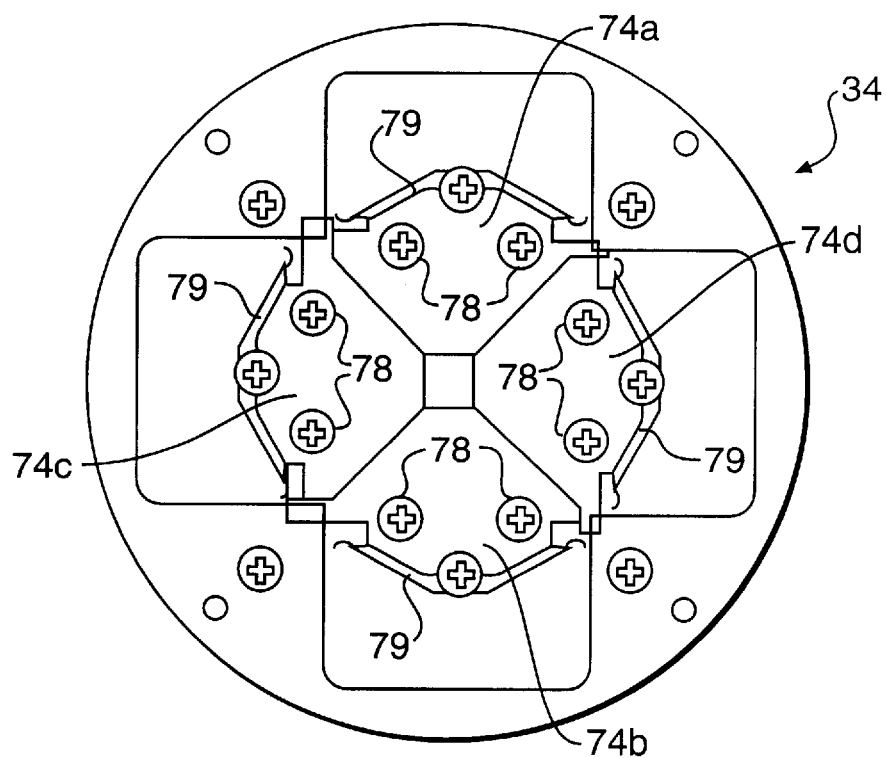
FIG. 10 is a bottom view of pressing member driving plates installed on the bottom plate of FIG. 9, in the fully closed position.
Figure 11:
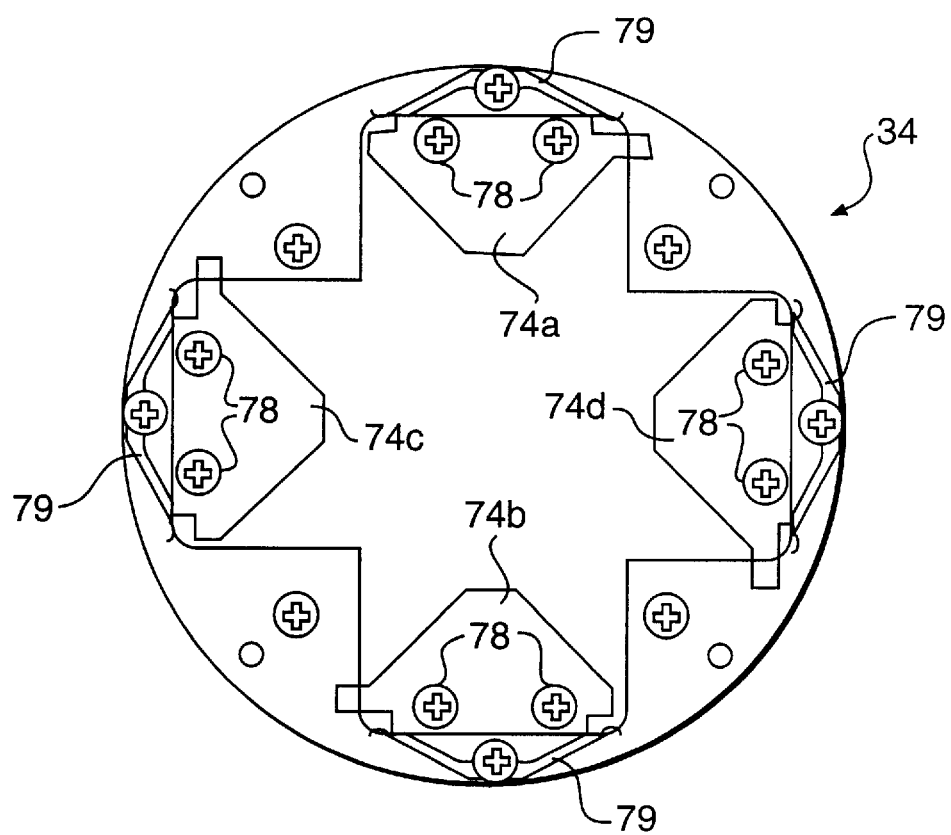
FIG. 11 is a bottom view of the pressing member driving plates installed on the bottom plate of FIG. 9, in the fully is retreated position.

As shown in FIG. 10, each of the pressing member driving plates 74a and 74d is combined with a combination pin 78 and a plate spring 79. In FIG. 10, the pressing member driving plates 74a–74d have fully advanced toward one another. In FIG. 11, the pressing member driving plates are shown fully retracted or moved apart.

Figure 12:
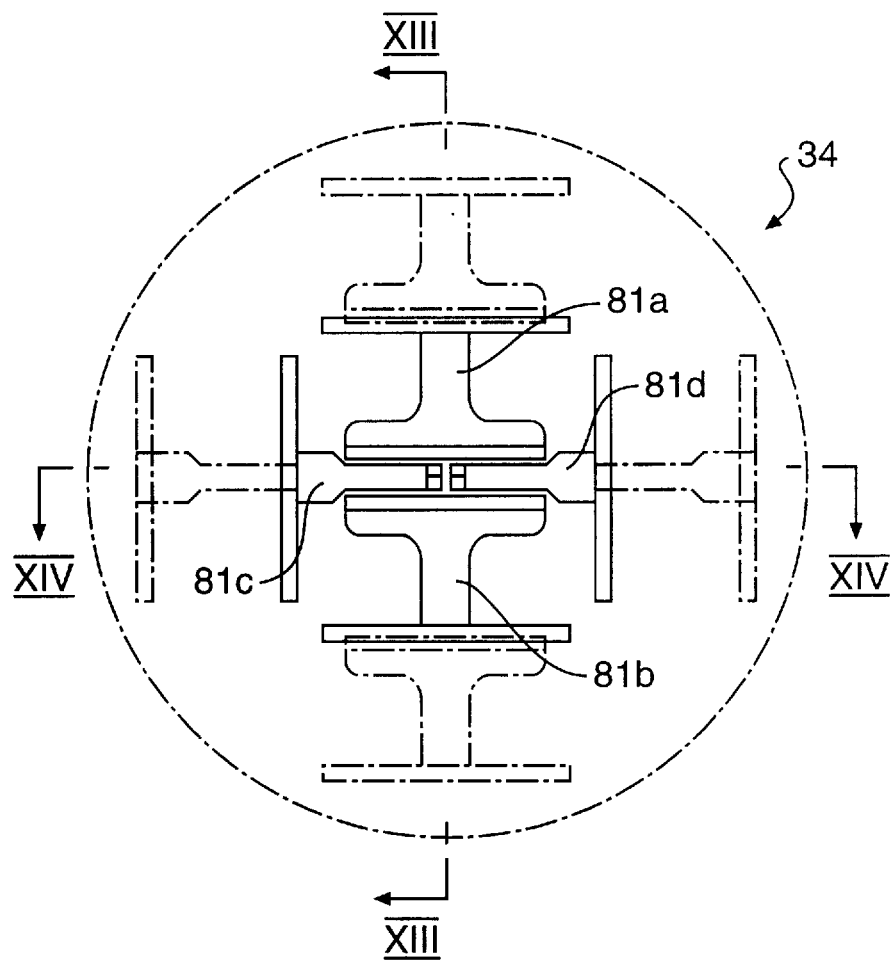
FIG. 12 is a bottom view of pressing members installed on the pressing member driving plates.

As shown in FIG. 12, pressing members 81a81d are inserted between the combination pins 78 and the plate springs 79 in the pressing member driving plates 74a–74d so that the pressing members 81a–81d can be detached.

First pressing members 81a and 81b are disposed to face each other, and second pressing members 81c and 81d are disposed to face each other at a predetermined angle with the first pressing members 81a and 81b.

Figure 13:
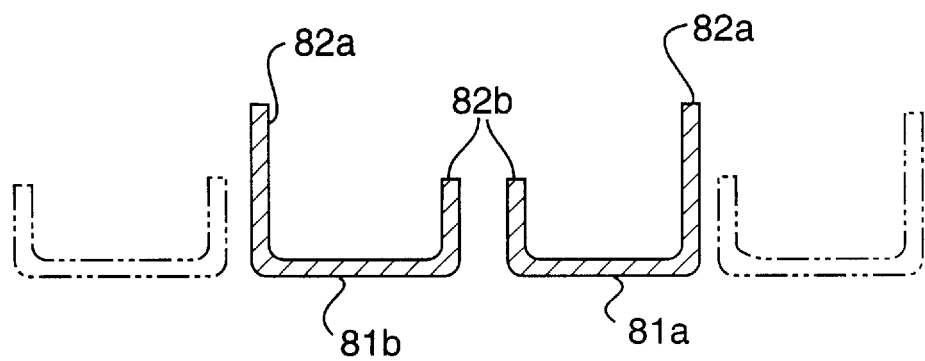
FIG. 13 is a sectional view taken along line XIII—XIII of FIG. 12.
Figure 14:
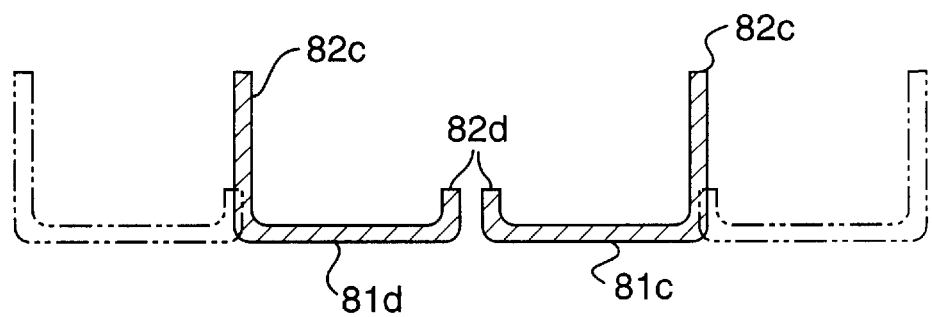
FIG. 14 is a sectional view taken along line XIV—XIV of FIG. 12.

FIG. 13 is a sectional view taken along line XIII—XIII of FIG. 12. FIG. 14 is a sectional view taken along line XIV—XIV of FIG. 12. The first pressing members 81a and 81b combined with the pressing member driving plates 74a and 74b have outer pressing portions 82a, and inner pressing portions 82b lower than the outer pressing portions 82a. The second pressing members 81c and 81d combined with the pressing member driving plates 74c and 74d have outer pressing portions 82c, and inner pressing portions 82d lower than the outer pressing portions 82c. The inner pressing portions 82b of the first pressing members 81a and 81b are higher than the inner pressing portions 82d of the second pressing members 81c and 81d.

Since the pressing members 81a–81d have different heights as described above, and they have relatively short movement strokes, from the virtual lines to the solid lines, as shown in FIGS. 13 and 14, electronic components of various sizes can be clamped while reducing movement stroke.

The process of mounting an electronic component on the board 20 by the above component mounting apparatus will be described.

The suctorial bit 25 of the mounting head 24 moves to the predetermined component stage 23 by simultaneously moving the cross-bar 5 in the Y-axis direction and the mounting head 24 along the cross-bar in the X-axis direction. Here, the hollow rod 40 advances downwardly or descends by the driving force of the motor 45, such that the suctorial bit 25 makes contact with the component. The component is then picked up and held against the suctorial bit 25 by vacuum pressure provided by the vacuum pump 27.

Then, the hollow rod 40 retreats upward or ascends by the driving force of the motor 45. After the suctorial bit 25 holding the component ascends to the pressing members 81a–81d, the first pair of pressing members 81a and 81b and the second pair of pressing members 81c and 81d approach each other, independently, by the driving motors 53 and 54. Thus, even if the component is not square but some other rectangle, proper clamping and positioning the component are ensured. In the case of a rectangular component, the component can be clamped by rotating the motors 53 and 54 at different rotating speeds.

While clamped, the component is positioned and fixed by a little elasticity or the plate spring 79. This clamping operation can be performed while the component is being transferred to a predetermined position on the board 20 by the mounting head 24. In the process of transferring, the component is clamped by the pressing members 81a–81d. Therefore, even if the component is rapidly transferred, the component is prevented from falling off the suctorial bit 25.

Figure 15:
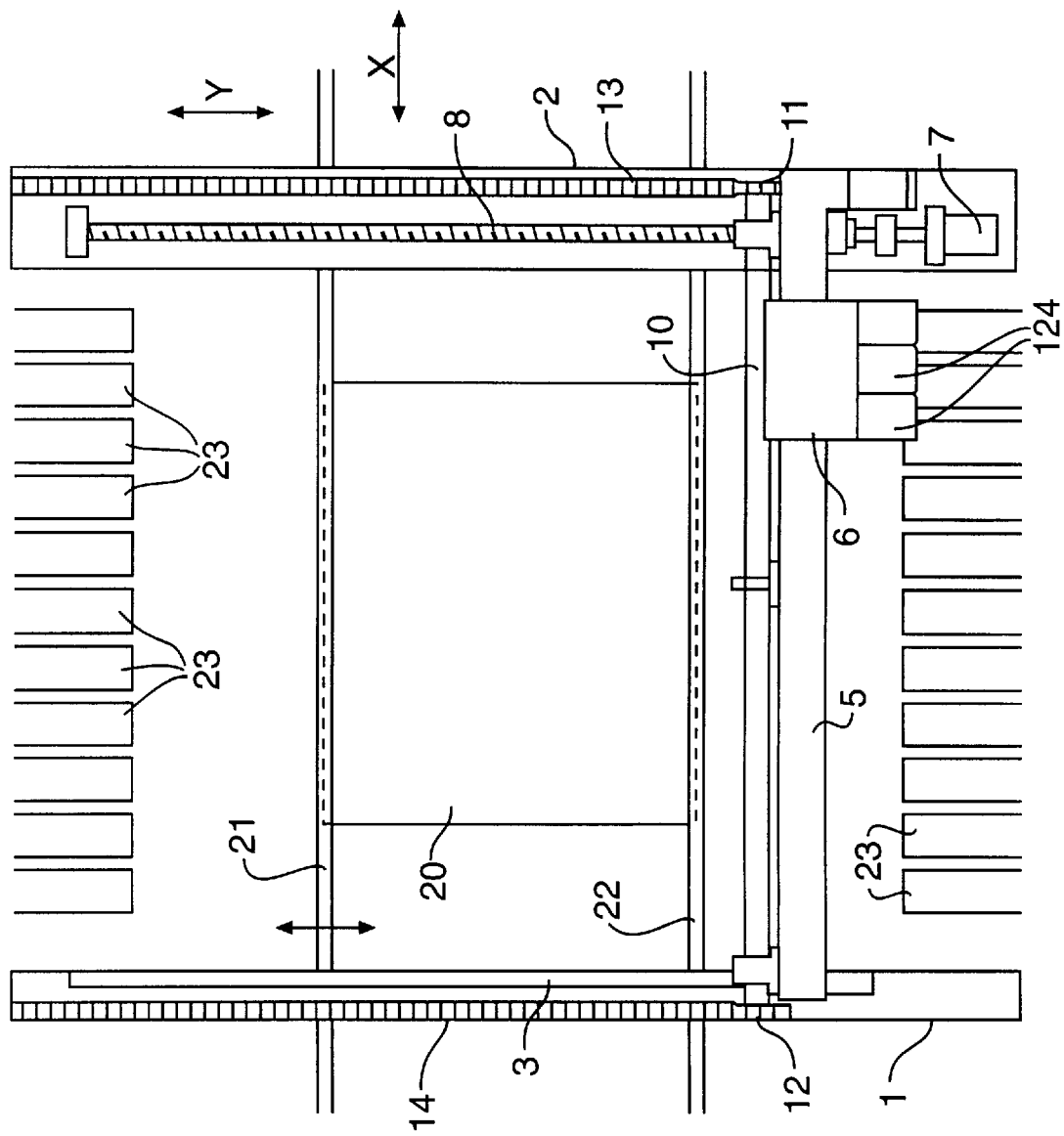
FIG. 15 is a schematic plan view of a component mounting apparatus according to another embodiment of the present invention.
Figure 16:
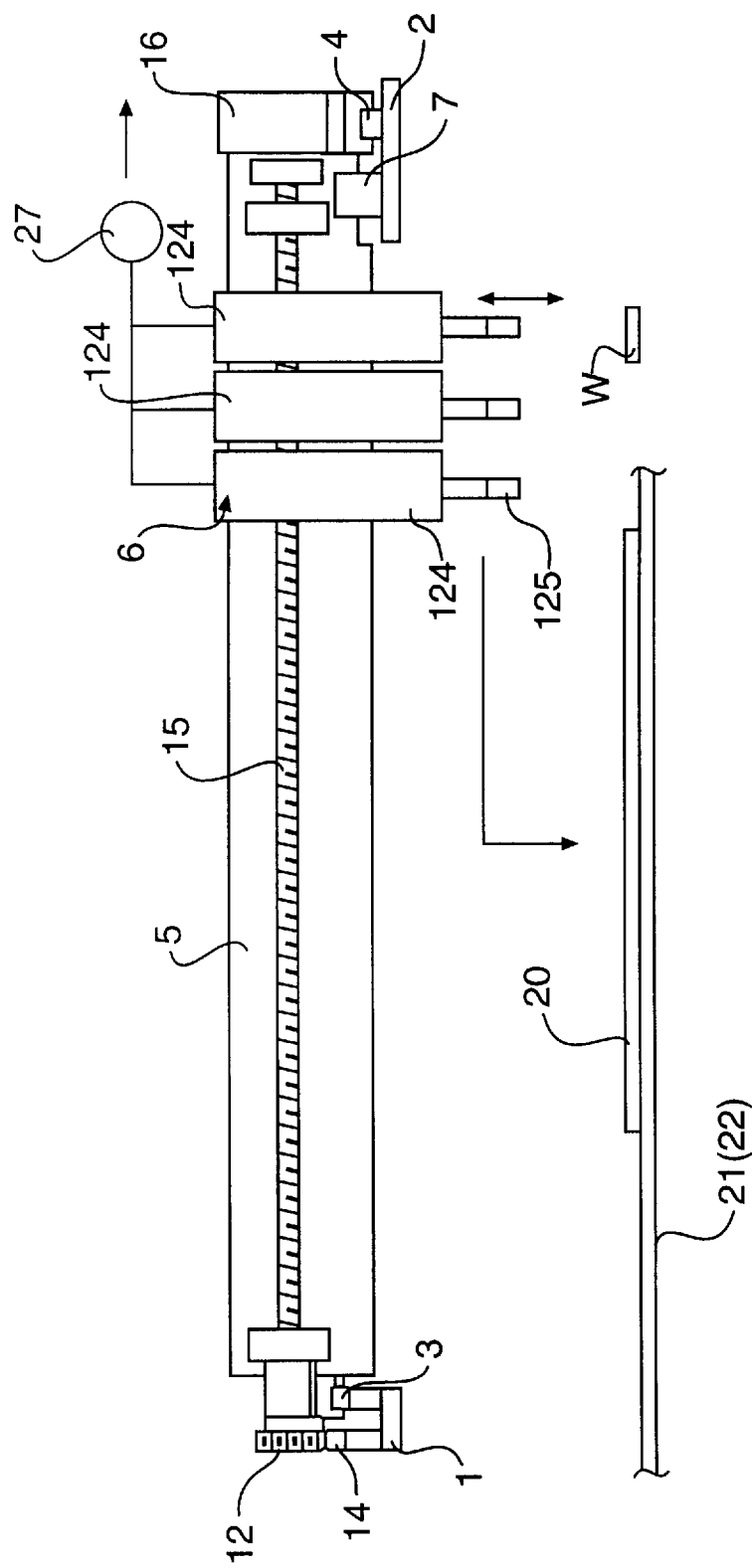
FIG. 16 is a front view of the component mounting apparatus of FIG. 15.
Figure 17:
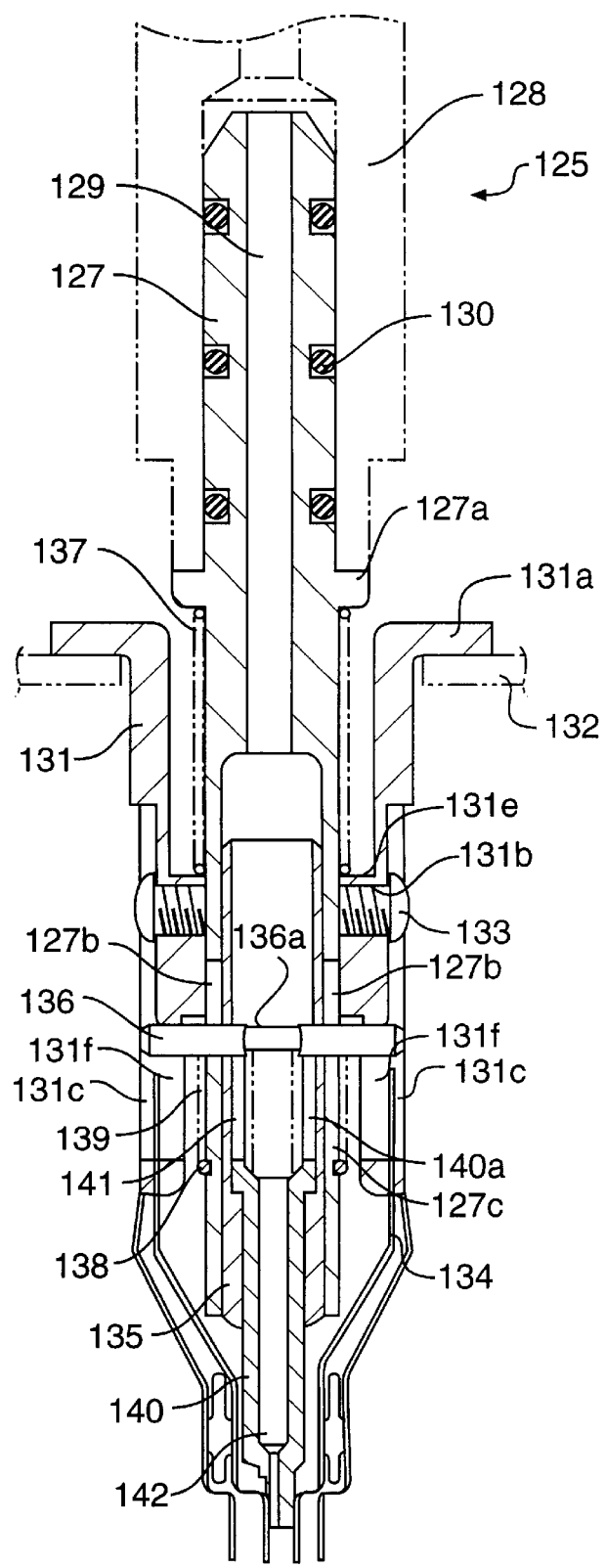
FIG. 17 is a sectional view of the suctorial bit of the component mounting apparatus of FIG. 16.
Figure 18:
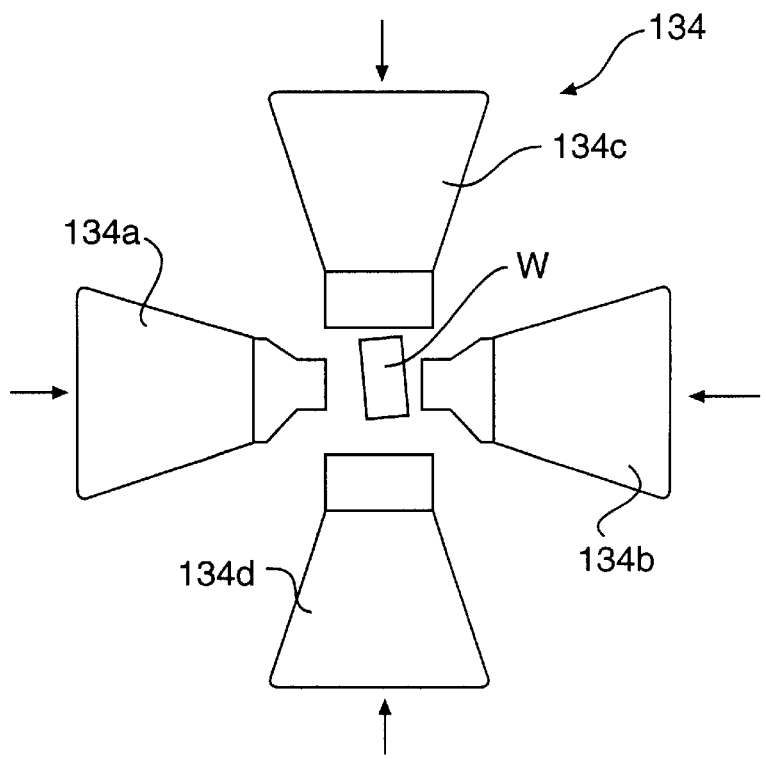
FIGS. 18A and 18B are views for explaining the positioning of the plate spring of FIG. 17.
Figure 18B:
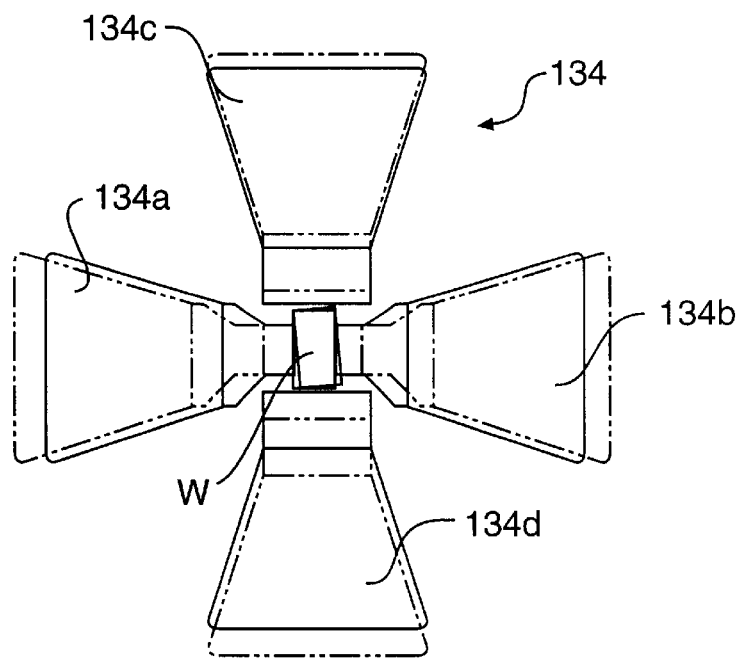

FIG. 15 is a schematic plan view of a component mounting apparatus according to a second embodiment of the present invention. FIG. 16 is a schematic front view of the component mounting apparatus of FIG. 15. Reference numerals in FIGS. 15 and 16 denote the same elements as those of FIGS. 1 and 2. FIG. 17 is a schematic sectional view of suctorial bit of the component mounting apparatus of FIG. 16. FIGS. 18A and 18B are views for explaining the positioning of the plate spring of FIG. 17.

Like the mounting head 24 of the first embodiment, a mounting head 124 of the second embodiment is installed to move between a component supporting stage 23 for supporting a component and the board 20 where the component is mounted, and has a suctorial bit 125 which moves up and down. However, unlike the first embodiment, the mounting head 124 is not provided with the pressing member driving housing 34, the pressing members 81a–81d, and the motors 53 and 54 for driving these pressing members.

The suctorial bit 125 of the second embodiment picks up and mounts a component onto the printed board 20 in the same manner as that of the first embodiment. That is, the component is picked up from a component stage 23 and mounted onto a predetermined position of the printed board 20 by moving the cross-bar 5 in the Y-axis direction along the horizontal supporting members 1 and 2, and moving the mounting head 124 in the X-axis direction along the cross-bar 5. To pick up the component, the suctorial bit 125 moves down toward the component stage 23 to pick-up the component and then moves upward towards the predetermined position of the printed board 20. Then, the suctorial bit 125 moves down again, mounting the component onto the predetermined position of the printed board 20.

The main body 127 of the suctorial bit 125 is fixed in an up-and-down, or in other words a vertical, driving portion 128 of the mounting head 124. The vertical driving portion 128 corresponds to the hollow rod 40 of FIG. 3 in the first embodiment. A through hole 129 is vertically formed in the main body 127. The space between the main body 127 and the vertical driving portion 128 is sealed by seal members 130 which fit into grooves formed into the outer surface of the main body 127, thereby making the through hole 129 airtight.

A hollow pipe member 131 fits with the main body 127 to move up and down along the axis of the main body 127. A flange 131a is formed in the upper portion of the hollow pipe member 131 to be caught over a fixing portion 132 of the mounting head 124, so that the hollow pipe member 131 is prevented from moving down.

A plurality of screw holes 131b are formed into the side surfaces of the hollow pipe member 131, and four plate springs 134 serving as the component positioning means are combined with the outer surface of the hollow pipe member 131 by screws 133 fit into the screw holes 131b, while being inserted into spring grooves 131c. The plate springs 134 protrude from the leading end of the hollow pipe member 131. That is, the ends of the plates 134 are disposed lower than that of the hollow pipe member 131. The plate springs 134 are elastically biased inward, that is, the ends approaching one another, and the end portions of the plate springs 134 are bent inward. As shown in FIGS. 18A & B, the bent portions of a pair of plate springs 134a and 134b, the respective end portions facing each other in parallel, are the same in size, while the ends of the other pair of plate springs 134c and 134d are different from each other in size. Therefore, the edges of these four plate springs 134 form a rectangle corresponding to the shape of the component to be picked up (bottom view).

An inner hollow pipe member 135 is installed to slide along the main body 127 in the hollow pipe member 131. Slots 127b and 131f are axially extended in the bit main body, 127 and the hollow pipe member 131, respectively. A pin 136 is combined with the slots 127b and 131f to penetrate through the inner hollow pipe member 135. Therefore, the hollow pipe member 131, the main body 127 and the inner hollow pipe member 135 are prevented front rotating separately and, due to a pin 136, axially slide to a predetermined extent.

A compression coil spring 137 is installed between a flange 127a formed on the outer surface of the bit main body 127 and a flange portion 131e formed on the inner surface of the hollow pipe member 131. The pin 136 is brought into contact with the slot 127b of the main body 127 by the elasticity of the compression coil spring 137. A compression coil spring 139 is inserted between a detent ring 138 installed in an annular groove 127c which is formed on the outer surface of the main body 127 and the pin 136, to elastically bias the detent ring 138 and the pin 136 in the direction in which they retreat or move away from each other.

A component pick-up member 140 is slidably installed in the inner hollow pipe member 135. Therefore, the component pick-up member 140 can move along the axis of the main body 127 by the inner hollow pipe member 135. A groove 140a is axially formed to fit with the pin 136 in the component pickup member 140 in the four plate springs 134, thus preventing the movement of the component pick-up member 140. A compression coil spring 141 is installed between the component pick-up member 140 and the pin 136. An end of the compression coil spring 141 is inserted into a small-diameter portion 136a formed in the center of the pin 136. Thus, the axial deviation of the pin 136 is prevented.

The component pick-up member 140 is formed with a nozzle hole 142 axially communicating with the through hole 129 of the main body 127. The electronic component is picked up by the vacuum pressure of the vacuum pump 27 (see FIG. 16) through the through hole 129 and the nozzle hole 142.

In the component mounting apparatus as constituted above, if the vertical driving portion 128 of the mounting head 124 moves downwardly toward the component placed on the component stage 23, the entire suctorial bit 125 moves downward. The hollow pipe member 131 stops in a predetermined position in its descent by the fixing portion 132 caught over the flange 131a.

Since the pin 136 is in close contact with the upper end of the slot 131f formed in the hollow pipe member 131 by the pressing force of the compression coil spring 139, the inner hollow pipe member 135 and the component pick-up member 140 through which the pin 136 penetrates a stop, and only the bit main body 127 continues descending by the vertical driving portion 128.

As the bit main body 127 thus descends toward the component stage 23, the plate springs 134, their ends being elastically biased inward, are pressed by the end of the main body 127 and opened outward. Thus, the widths between the ends of the plate springs 134 get larger.

Thereafter, if the main body 127 continues its downwardly movement, the pin 136 contacts the other end, i.e., the upper end of the slot 127b, and thus the pin 136 moves further downward together with the bit main body 127.

Therefore, the inner hollow pipe member 135 through which the pin 136 passes and the component pick-up member 140 connected to the inner hollow pipe member 135 by the compression coil spring 141 move downwardly along with the main body 127. Thus, the component pick-up member 140 protrudes from the plate springs 134 of which the widths get larger and descends toward the component.

The suctorial surface of the component pick-up member 140 contacts the upper surface of the component, before the main body 127 reaches its lowest point, and the component is picked up and held by the component pick-up member 140 by the vacuum pressure applied to the nozzle hole 125 communicating with the vacuum pump 27 via the through hole 129 of the main body 127. When the component pick-up member 140 contacts the component, even though the main body 127 moves further downwardly by the vertical driving portion 128, the component pick-up member 140 moves relative to the main body 127 while compressing the compression coil spring 141 by the groove 140a combined with the pin 136. Accordingly, an overstroke condition, which occurs when the component is picked up and which is caused by an error between the stroke of the vertical portion 128 and the height of the component, is prevented, and thus the component pick-up member 140 is prevented from applying excess force to the component.

When the component is picked up by the component pick-up member 140, the main body 127 moves upwardly by the vertical driving portion 128.

When the main body 127 moves upward, that is, ascends, and the pin 136 moves toward the opposite end of the slot 127b of the main body 127, the component pick-up member 140 temporarily stops, and the main body 127 is detached from the plate springs 134. Then, the widths between the ends of the plate springs 134 decrease. For instance, as shown in FIG. 18A, the component picked up in an improper position is moved and/or rotated while being laterally pressed by the individual plate spring 134a, 134b, 134c and 134d which face one another, and is properly positioned and inserted among the plate springs 134, as shown in FIG. 18B. The component is raised to its uppermost position by the main body 127 which moves upwardly by the vertical driving portion 128.

The suctorial bit 125 holding the component moves toward a predetermined position of the printed board 20 by the movement of the mounting head 124. At the proper position, the component moves downwardly in the same procedure as described above, until the lower surface of the component reaches the mounting surface of the printed board 20. Then, when the vacuum pressure is removed, the component is detached from the component pick-up member 140, and mounted onto the predetermined position of the printed board 20.

Thereafter, the suctorial bit 125 moves upwardly and moves back to the component stage 23 by the mounting head 124. To mount a new component onto the printed board 20, the thus-described pick-up procedure repeats.

As described above, in this embodiment, the widths between the ends of the plate springs 134 attached to the hollow pipe member 131 become larger by the downward movement of the bit main body 127. In this state, the component pick-up member 140 protrudes from the plate springs 134 and picks up the component. Then, the component picked up by the component pick-up member 140 is positioned with respect to the component pick-up member 140 while being pressed by the plate springs 134, widths between the ends which become smaller by the retreating movement of the main body 127. Accordingly, the component is inserted into and held by the plate springs 134.

Therefore, the component is positioned by the plate springs 134 which are light, and high-speed positioning can be performed without great impact on the component. As a result, damage of the component is prevented.

Further, since the plate springs 134 for positioning the component are installed in the suctorial bit 125, the vertical distance between a positioning portion of the plate springs 134 and the suctorial surface of the component pick-up member 140 is minimized. Thus, when picking up and mounting a component, the up and down stroke of the suctorial bit 125 can be reduced to a great extent, and mounting operations can be performed rapidly.

As described above, the present invention is depicted on the basis of the above embodiment. The present invention, however, is not limited to the above embodiment and many variations are possible within the scope and spirit of the present invention by one skilled in the art.

For instance, the four plate springs 134 used as component positioning means in the present invention can be replaced with two L-shaped plate springs which are elastically biased inward. In addition, the plate springs are an exemplary application, and thus a pin bent into a predetermined shape can be used instead. Therefore, articles other than the plate springs 134 can be used and their number can also be varied, so long as the component is positioned according to decrease in the width.

According to the first embodiment, the present invention has following advantages: (1) components of various configurations including any rectangle can be clamped since a plurality of pressing member pairs are provided, each pressings member pair being driven by its corresponding motor; (2) components of different dimensions can be clamped without increasing the movement stroke of the pressing members; and (3) while clamped, a component can be accurately positioned.

According to the second embodiment, the present invention has following advantages: (1) since an electronic component is accurately positioned with respect to component pick-up means and held by reducing the width of component positioning means, the positioning is smooth and rapid positioning can be performed without great physical impact on the component; and (2) the vertical distance between a positioning portion of the component positioning means and the suctorial surface of the component pick-up means can be minimized, due to the incorporated installation of the component positioning means and the suctorial bit. Accordingly, the stroke while picking up and mounting the component is short and mounting operations can be rapidly performed.

What is claimed is:

1. A component mounting apparatus for mounting a component onto a board, comprising:

a cross-bar movably connected to the apparatus to move in a Y-axis direction;

a mounting head slidably coupled to the cross-bar to move in an X-axis direction;

a pressing member driving housing installed at one end of the mounting head;

a hollow rod installed in the mounting head to axially slide through the pressing member driving housing and having at one end a suctorial bit for picking up and holding a component via vacuum pressure;

a first pair of pressing members, installed in the pressing member driving housing and opposing each other to move toward and away from the hollow rod;

a first motor:

a first power transferring mechanism for transferring power from the first motor to the first pair of pressing members:

a second pair of pressing members disposed at a predetermined angle with respect to the first pair of pressing members to move toward and away from the hollow rod for clamping and releasing the component in cooperation with the first pair of pressing members;

a second motor: and a second power transferring mechanism for transferring power from the second motor to the second pair of pressing members.

2. A component mounting apparatus of claim 1, wherein each of the first and second pairs of pressing members has an inner pressing portion and an outer pressing portion whereby each pair of pressing members can clamp and release a component held by the suctorial bit.

3. A component mounting apparatus of claim 1, wherein the pressing members are detachably installed in the pressing member driving housing.

4. A component mounting apparatus of claim 1, further comprising a spring member for elastically biasing each pressing member toward the hollow rod.

* * * * *